US010818828B2

(12) United States Patent
Adams et al.

(10) Patent No.: US 10,818,828 B2
(45) Date of Patent: Oct. 27, 2020

(54) METHOD AND APPARATUS FOR A LOW PROFILE LIGHT FIXTURE

(71) Applicant: Illum Horticulture LLC, Mesa, AZ (US)

(72) Inventors: Stephen P. Adams, Mesa, AZ (US); Johnathan J. Heiner, Mesa, AZ (US)

(73) Assignee: Illum Horticulture LLC, Mesa, AZ (US)

( * ) Notice: Subject to any disclaimer, the term of this patent is extended or adjusted under 35 U.S.C. 154(b) by 0 days.

(21) Appl. No.: 16/516,834

(22) Filed: Jul. 19, 2019

(65) Prior Publication Data

US 2020/0028041 A1 Jan. 23, 2020

Related U.S. Application Data

(60) Provisional application No. 62/702,004, filed on Jul. 23, 2018.

(51) Int. Cl.
| | |
|---|---|
| *F21V 1/00* | (2006.01) |
| *H01L 33/58* | (2010.01) |
| *H01L 25/075* | (2006.01) |
| *H01L 33/62* | (2010.01) |
| *H01L 33/64* | (2010.01) |
| *A01G 7/04* | (2006.01) |
| *F21V 7/00* | (2006.01) |
| *F21Y 115/10* | (2016.01) |

(52) U.S. Cl.
CPC .............. *H01L 33/58* (2013.01); *A01G 7/045* (2013.01); *F21V 7/0016* (2013.01); *H01L 25/0753* (2013.01); *H01L 33/62* (2013.01); *H01L 33/647* (2013.01); *F21Y 2115/10* (2016.08); *H01L 2933/0058* (2013.01); *H01L 2933/0066* (2013.01); *H01L 2933/0075* (2013.01)

(58) Field of Classification Search
CPC ....... H01L 33/58; H01L 33/62; H01L 33/647; F21V 7/045; F21V 7/0016; F21V 31/005; F21Y 2115/10; F21Y 2105/10
USPC .......................................... 362/235
See application file for complete search history.

(56) References Cited

U.S. PATENT DOCUMENTS

| 2011/0134239 A1* | 6/2011 | Vadai | F21K 9/23 |
| | | | 348/143 |
| 2011/0273864 A1* | 11/2011 | Izawa | F21V 9/30 |
| | | | 362/84 |
| 2016/0170160 A1* | 6/2016 | Akabane | G02B 6/4239 |
| | | | 385/14 |
| 2018/0128476 A1* | 5/2018 | Sokolov | F21S 4/28 |

(Continued)

*Primary Examiner* — Ali Alavi
(74) *Attorney, Agent, or Firm* — Michael T. Wallace

(57) ABSTRACT

A method and apparatus for a horticultural light for use in a horticultural facility is provided to minimize a dimension (e.g., height dimension) of the horticultural light. A sheet lens is adhered directly onto the printed circuit board and optionally the underlying metallic backing plate so as to environmentally seal the horticultural light. The sheet lens is comprised of polycarbonate and is pneumatically and/or thermally manipulated to include dome portions that are disposed in proximity to the respective one or more LEDs. Light generated by the LED is incident onto the inner surface of the respective dome portion at right angles through the entire beam angle. Accordingly, substantially none of the light is reflected back into the dome, but is rather propagated to an exterior of the light.

14 Claims, 3 Drawing Sheets

(56) References Cited

U.S. PATENT DOCUMENTS

2018/0195708 A1* 7/2018 Sokolov .................... F21S 8/00
2019/0126576 A1* 5/2019 Mori .................... G02B 3/0031

* cited by examiner

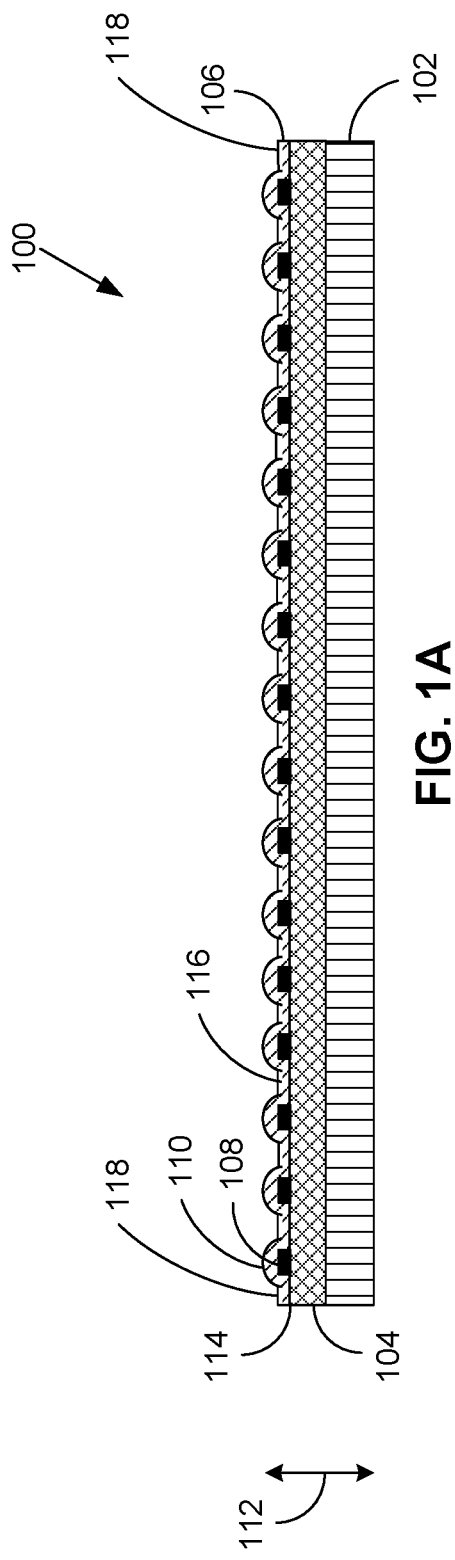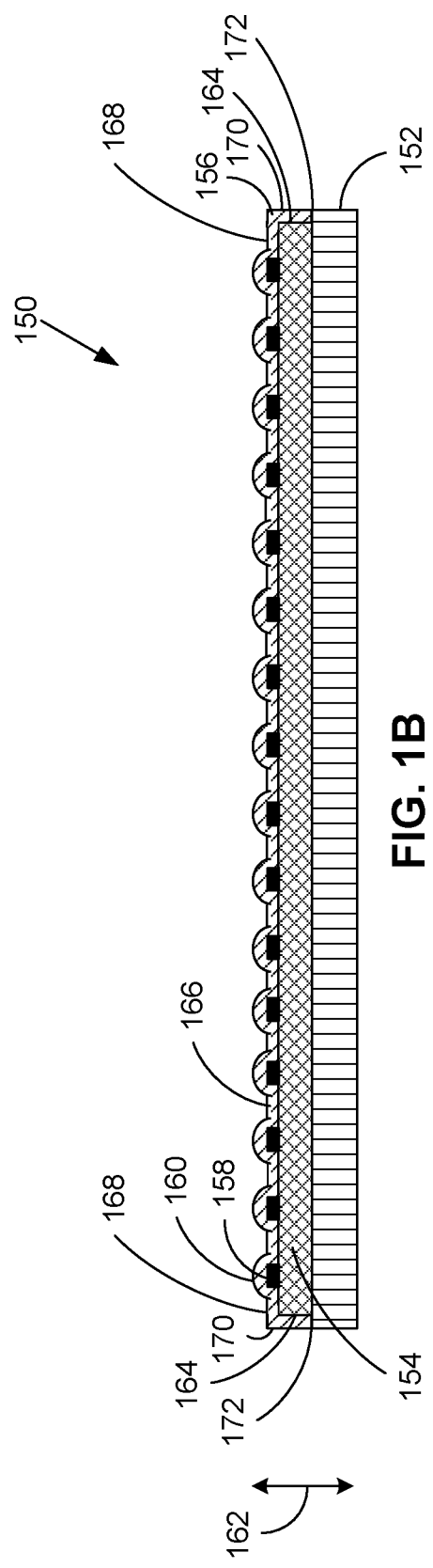

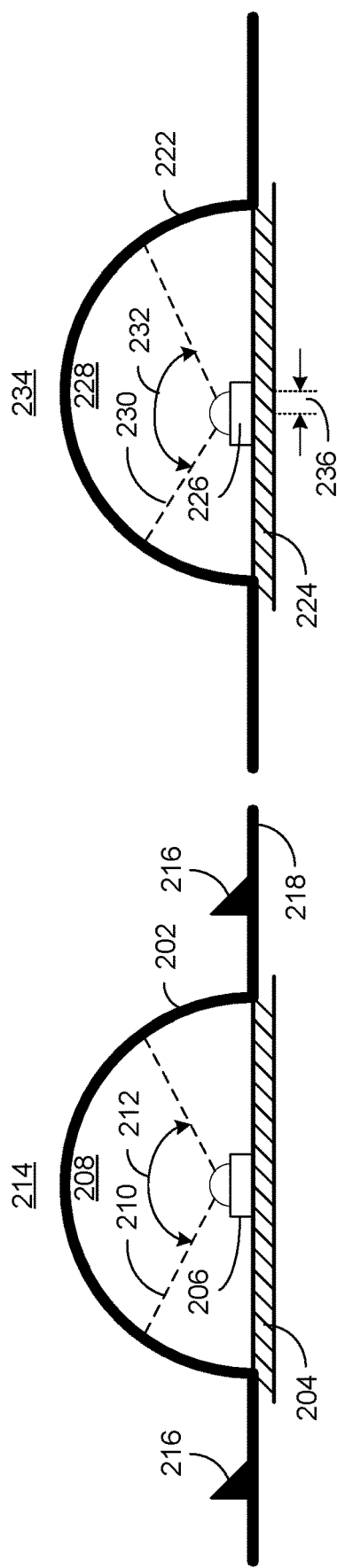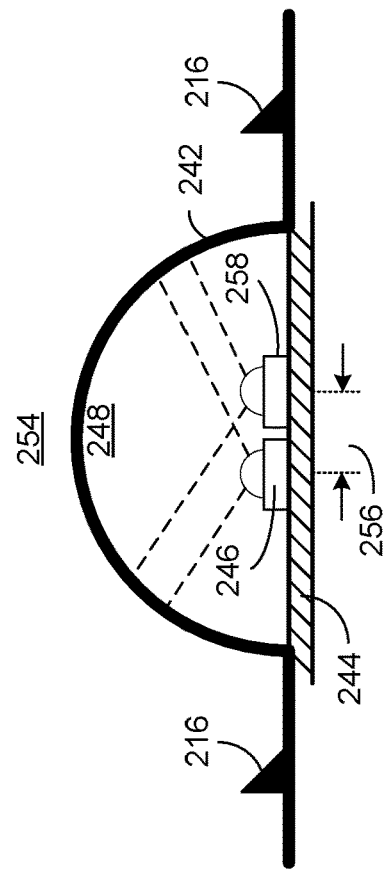

METHOD AND APPARATUS FOR A LOW PROFILE LIGHT FIXTURE

FIELD OF THE INVENTION

The present invention generally relates to horticultural lights, and more particularly to very low profile horticultural lights.

BACKGROUND

Light emitting diodes (LEDs) have been utilized since about the 1960s. However, for the first few decades of use, the relatively low light output and narrow range of colored illumination limited the LED utilization role to specialized applications (e.g., indicator lamps). As light output improved, LED utilization within other lighting systems, such as within LED "EXIT" signs and LED traffic signals, began to increase. Over the last several years, the white light output capacity of LEDs has more than tripled, thereby allowing the LED to become the lighting solution of choice for a wide range of lighting solutions.

LEDs exhibit significantly optimized characteristics, such as source efficacy, optical control and extremely long operating life, which make them excellent choices for general lighting applications. LED efficiencies, for example, may provide light output magnitudes up to 200 lumens per watt of power dissipation. Energy savings may, therefore, be realized when utilizing LED-based lighting systems as compared to the energy usage of, for example, incandescent, halogen, compact fluorescent and high-intensity discharge (HID) lighting systems. As per an example, an LED-based lighting fixture may utilize a small percentage (e.g., 15-20%) of the power utilized by an HID-based lighting system, but may still produce an equivalent magnitude of light.

In some instances, horticultural lighting applications are very limited in the amount of space that may be allocated between the light fixture and the target that is to be illuminated. Accordingly, most if not all conventional horticultural light fixtures available today may not be appropriately sized for the many applications that require minimized space allocations.

Efforts continue, therefore, to develop a horticultural lighting system that exceeds the performance parameters of conventional lighting systems while minimizing critical dimensions of the lighting systems.

SUMMARY

To overcome limitations in the prior art, and to overcome other limitations that will become apparent upon reading and understanding the present specification, various embodiments of the present invention disclose methods and apparatus for horticultural lighting systems designed for operation in confined spaces where one or more dimensions (e.g., a dimension that is aligned with the optical axis of the horticultural light) must be minimized.

In accordance with one embodiment of the invention, a light fixture comprises a printed circuit board, an array of LEDs coupled to the printed circuit board. Each LED of the array of LEDs is configured to produce a first light distribution. The light fixture further comprising a sheet lens including a plurality of dome portions, each dome portion having an interior surface disposed in proximity to a respective LED of the array of LEDs. A distance between any point along the interior surface of the dome portion and each respective LED is substantially constant.

In accordance with an alternate embodiment of the invention, a light fixture comprises a printed circuit board, an array of LEDs coupled to the printed circuit board. Each LED of the array of LEDs is configured to produce a first light distribution. The light fixture further comprising a sheet lens including a plurality of dome portions, each dome portion having an interior surface disposed in proximity to two or more LEDs of the array of LEDs. A radius of the dome portion is substantially constant.

In accordance with an alternate embodiment of the invention, a method comprises manipulating a sheet lens to form dome portions and flat portions within the sheet lens, placing a plurality of LEDs onto a printed circuit board, establishing a substantially fixed distance between an entire inner surface of each dome portion and a corresponding LED of the plurality of LEDs and adhering the sheet lens to the printed circuit board to protect the plurality of LEDs from contaminants.

BRIEF DESCRIPTION OF THE DRAWINGS

Various aspects and advantages of the invention will become apparent upon review of the following detailed description and upon reference to the drawings in which:

FIGS. 1A and 1B illustrate LED-based horticultural lights in accordance with several embodiments of the present invention;

FIGS. 2A, 2B and 2C illustrate details of the dome portions of the LED-based horticultural light of FIGS. 1A and 1B in accordance with several embodiments of the present invention.

DETAILED DESCRIPTION

Figure 3:
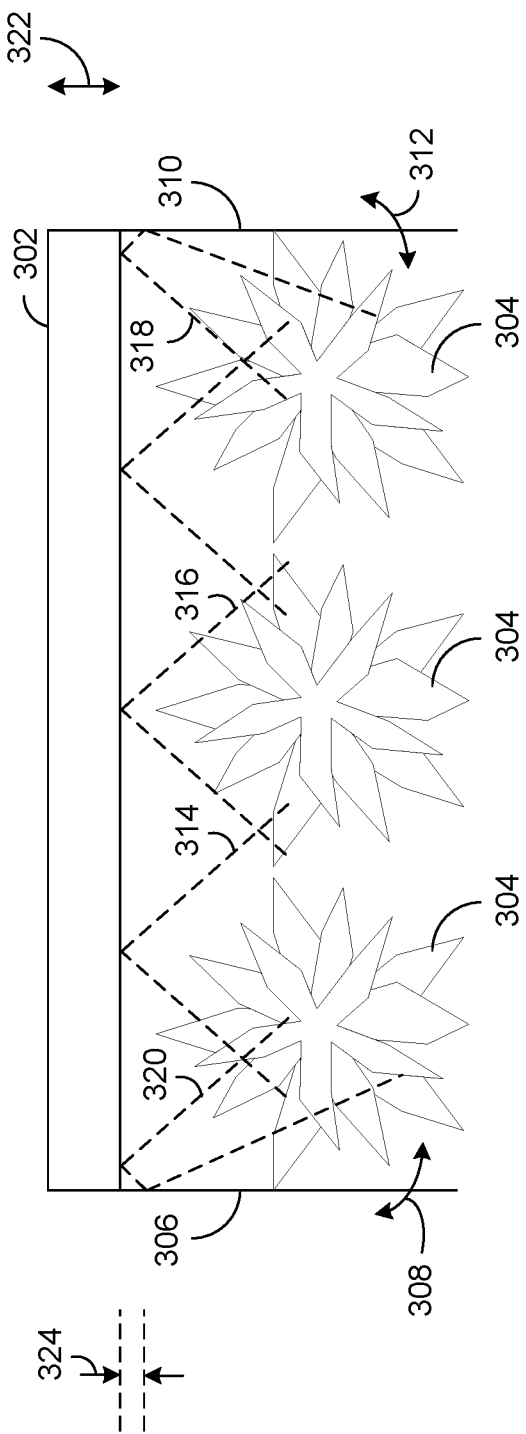
FIG. 3 illustrates an LED-based horticultural light in accordance with another embodiment of the present invention.

Generally, the various embodiments of the present invention are applied to a light emitting diode (LED) based light fixture that may contain an array of LEDs disposed onto a printed circuit board (PCB). The PCB may utilize a metallic backing layer (e.g., an aluminum backing layer that may include aluminum heat sink fins) that may facilitate heat transfer from the LEDs to the metallic backing layer and optional heat sink fins, which may then be transferred into the atmosphere by convection thereby reducing the temperature of the light fixture and associated LEDs.

In alternate embodiments, the optional heat sink fins may be eliminated and implemented instead using additional structure built into the metallic backing layer. For example, metallic backing layer may be implemented using a corrugated surface rather than a flat surface. Accordingly, additional surface area may be achieved on the metallic backing layer itself, which may add structural integrity while at the same time may increase the amount of surface area that may be used to extract heat from the LEDs.

The light may also be made to restrict/eliminate ingress of environmental contaminants (e.g., water and dirt) according to a particular ingress protection (IP) rating that may be associated with the light fixture. As an example, a substantially transparent sheet (e.g., polycarbonate sheet) may be disposed onto the light fixture so as to seal the LEDs and PCB from external contaminants, while simultaneously allowing light from the LEDs to be transmitted through the sheet. In addition, the sheet may be formed so as to minimize/eliminate the amount of light that may be reflected back into the light fixture from the sheet, thereby increasing efficiency by a percentage (e.g., 6-12 percent) relative to traditional light fixtures that utilize flat sheets.

In one embodiment, the sheet may be formed in any number of ways (e.g., vacuum and/or thermal) to exhibit any number of features. For example, the sheet may be formed to exhibit dome features that are to be disposed in proximity (e.g., above) one or more LEDs. Each dome feature may exhibit a spherical shape (e.g., a hemispherical shape) with a substantially constant radius. The sheet may then be attached (e.g., via adhesive) to the PCB and/or metallic backing in such a way as to seal the PCB and associated LEDs from contaminants. As discussed in more detail below, the dome features of the sheet may minimize/eliminate any light that may be reflected back into the light fixture by the sheet.

Additional features may be introduced into the sheet as well. For example, bulges may be formed into the sheet to accommodate a volume for circuitry that may be mounted to the associated PCB. In alternate embodiments, for example, ridges may be molded into the sheet to add mechanical rigidity to the sheet.

Turning to FIG. 1A, a side view of light fixture 100 is exemplified, in which a dimension (e.g., dimension 112 aligning with the optical axis of light fixture 100) may be minimized, thereby allowing an amount of space between light fixture 100 and the corresponding illuminated target (not shown) to be minimized. Light fixture 100 may include metallic backing layer 102 that may be comprised of any thermally conductive material (e.g., aluminum or copper), PCB 104, LEDs 108 and sheet 106 that may be comprised of a substantially transparent material (e.g., polycarbonate).

Sheet 106 may include dome portions 110 that may be aligned within a proximity to one or more respective LEDs 108, such that the light emitted by one or more LEDs 108 may be emitted substantially through each respective dome portion 110. That is to say, for example, that no light may be transmitted through flat portions 116 of sheet 106 by any of LEDs 108.

Interface 114 between sheet 106 and PCB 104 may be sealed through the use of any method (e.g., adhesive, gaskets, snap-fit joints, etc.) such that the ingress of contaminants (e.g., water and dirt) into the space occupied by LEDs 108 (and associated control electronics not shown) may be substantially eliminated. In one embodiment, for example, a pneumatic press may be used to impose a substantially constant force around the outer perimeter of sheet 106 (e.g., outer perimeter 118), such that a uniform bond may be created at interface 114 at all locations where sheet 106 contacts PCB 104 along outer perimeter 118. In an alternate embodiment, a pneumatic press in combination with a curing agent (e.g., ultra-violet light) may be used to cure the adhesive while pressing lens 106 against PCB 104, thereby securing lens 106 onto PCB 104 in an ingress protective fashion.

Turning to FIG. 1B, a side view of an alternate embodiment of light fixture 150 is exemplified, in which a dimension (e.g., dimension 162 aligning with the optical axis of light fixture 150) may be minimized, thereby allowing an amount of space between light fixture 150 and the corresponding illuminated target (not shown) to be minimized. Light fixture 150 may include metallic backing layer 152 that may be comprised of any thermally conductive material (e.g., aluminum or copper), PCB 154, LEDs 158 and sheet 156 that may be comprised of a substantially transparent material (e.g., polycarbonate).

Sheet 156 may include dome portions 160 that may be aligned within a proximity to one or more respective LEDs 158, such that the light emitted by the one or more LEDs 158 may be emitted substantially through each respective dome portion 160. That is to say, for example, that no light may be transmitted through flat portions 166 of sheet 156 by any of LEDs 158.

Interfaces 164 and 172 may exist between sheet 156 and PCB 154/metallic backing plate 152, respectively, which may be sealed through the use of any known method (e.g., adhesive, gaskets, snap-fit joints, etc.) such that the ingress of contaminants (e.g., water and dirt) into the space occupied by LEDs 158 (and associated control electronics not shown) may be substantially eliminated. In one embodiment, for example, a pneumatic press may be used to impose a substantially constant force around the outer perimeter of sheet 156 (e.g., outer perimeters 168 and 170), such that a uniform bond may be created at interfaces 164 and 172, respectively, at all locations where sheet 156 contacts PCB 154 and metallic backing plate 152 along outer perimeters 168 and 170, respectively. In an alternate embodiment, a pneumatic press in combination with a curing agent (e.g., ultra-violet light) may be used to cure the adhesive, thereby securing lens 156 onto PCB 154 and metallic backing plate 152 in an ingress protective fashion.

Turning to FIG. 2A, an enlarged view of a dome portion 202 (e.g., dome portions 110 or 160 of FIG. 1A or 1B) and associated LED 206 (e.g., LED 108 or 158 of FIG. 1A or 1B) is exemplified, whereby LED 206 may be centered within dome portion 202 as shown. Dome portion 202 may exhibit a spherical shape (e.g., a hemispherical shape) with a substantially constant radius. Ridges (e.g., ridges 216) of any shape may be formed into sheet 218 (e.g., formed into flat portions 116 of sheet 106 of FIG. 1A or flat portions 166 of sheet 156 of FIG. 1B) to, for example, enhance mechanical rigidity of sheet 218.

LED 206 may be mounted onto PCB 204 such that associated control and bias circuitry (not shown) in communication with PCB 204 may cause LED 206 to become illuminated. In response, illumination pattern 210 across a beam width (e.g., beam width 212) may be incident upon interior portions of dome 202 at substantially constant angles of incidence (e.g., angles of incidence substantially equal to 90 degrees with respect to the interior portions of dome 202), which may be below any angle that may cause reflectance of illumination pattern 210 back into dome 202. That is to say, in other words, that the distance between LED 206 and interior portions of dome 202 (e.g., a distance that is substantially equal to the radius of dome 202) may be substantially the same across the entire beam width 212. As a result, substantially none of the light generated by LED 206 may be reflected back into interior 208 of dome 202, but may instead be propagated to exterior 214 with substantially no refractive variations in the illumination propagated to exterior 214.

Turning to FIG. 2B, an enlarged view of a dome portion 222 (e.g., dome portion 110 or 160 of FIG. 1A or 1B) and associated LED 226 (e.g., LED 108 or 158 of FIG. 1A or 1B) is exemplified, whereby LED 226 may be offset within dome portion 222 to one side or another with respect to center (e.g., LED 226 is offset to the left of center as shown by dimension 236). Dome portion 222 may exhibit a spherical shape (e.g., a hemispherical shape) with a substantially constant radius.

LED 226 may be mounted onto PCB 224 such that associated control and bias circuitry (not shown) in communication with PCB 224 may cause LED 226 to become illuminated. In response, illumination pattern 230 across a beam width (e.g., beam width 232) may be incident upon interior portions of dome 222 at varying angles of incidence, which may be below any angle that may cause any reflectance of illumination pattern 230 back into dome 222. As a result, substantially none of the light generated by LED 226 may be reflected back into interior 228 of dome 222, but may instead be propagated to exterior 234 with refractive variations in the illumination propagated to exterior 234 commensurate with offset 236.

Turning to FIG. 2C, an enlarged view of a dome portion 242 (e.g., dome portion 110 or 160 of FIG. 1A or 1B) and associated LEDs 246 and 258 (e.g., LEDs 108 and the paired LED not shown or 158 and the paired LED not shown of FIG. 1A or 1B) is exemplified, whereby LEDs 246 and 258 may be offset within dome portion 242 to both sides with respect to center (e.g., LED 246 may be offset to the left of center and LED 258 may be offset to the right of center as shown by dimension 256). In one embodiment, dimension 256 may be substantially equal to a dimension of LEDs 246 and/or 258 (e.g., a percentage of the width or length of LED 246 and/or 258). Dome portion 242 may exhibit a spherical shape (e.g., a hemispherical shape) with a substantially constant radius.

LEDs 246 and 258 may be mounted onto PCB 244 such that associated control and bias circuitry (not shown) in communication with PCB 244 may cause LEDs 246 and 258 to become illuminated. In response, the illumination patterns of LEDs 246 and 258 across a beam width may be incident upon interior portions of dome 242 at varying angles of incidence, which are below any angle that may cause any reflectance of the respective illumination patterns back into dome 242. As a result, substantially none of the light generated by LEDs 246 and 258 may be reflected back into interior 248 of dome 242, but may instead be propagated to exterior 254 with refractive variations in the illumination propagated to exterior 254 commensurate with offset 256.

Any number of LEDs may be mounted below dome 242. For example, an array of four LEDs (2 rows of 2 LEDs per column) may be disposed below dome 242, such that the illumination patterns of the LEDs (not shown) across a beam width may be incident upon interior portions of dome 242 at varying angles of incidence, which are below any angle that may cause any reflectance of the respective illumination patterns back into dome 242. As per other examples, an array of nine LEDs (3 rows of 3 LEDs per column) or sixteen LEDs (4 rows of 4 LEDs per column) may be disposed below dome 242, such that the illumination patterns of the LEDs (not shown) across a beam width may be incident upon interior portions of dome 242 at varying angles of incidence, which are below any angle that may cause any reflectance of the respective illumination patterns back into dome 242.

Turning to FIG. 3, an exemplary horticultural system is exemplified, in which light fixture 302 (e.g., light fixture 100 or 150 of FIG. 1A or 1B) is engaged to illuminate plants 304 for a particular horticultural application. As discussed above, a dimension (e.g., vertical dimension 322) of light fixture 302 may be minimized, so as to allocate adequate room to accommodate plants 304 while providing adequate illumination patterns 314-320 to satisfy the needs of plants 304.

Light fixture 302 may also include wings 306 and 310 (e.g., removable wings 306 and 310) that may be coated with a reflective diffuser material and may be of any length and disposed onto light fixture 302 at any angle 308 and 312 (e.g., wings 306 and 310 may be mounted using hinges to create any angle or permanently fixed at any angle), respectively. Accordingly, light distributions 320 and 318 may be reflected onto the plants growing within the confines of wings 306 and 310 to utilize more of the light energy provided by light fixture 302.

The LEDs and associated dome portions within light fixture 302 may be spaced apart from one another so that complete mixing of the light distribution from light fixture 302 may occur at a minimum distance (e.g., distance 324) which may be between ¼ inch and 2 inches (e.g., approximately one inch) from light fixture 302.

Other aspects and embodiments of the present invention will be apparent to those skilled in the art from consideration of the specification and practice of the invention disclosed herein. For example, the lighting fixtures disclosed herein may not be limited only to horticultural applications, but may instead be applied wherever low-profile lighting fixtures may be desired. It is intended, therefore, that the specification and illustrated embodiments be considered as examples only, with a true scope and spirit of the invention being indicated by the following claims.

What is claimed is:

1. A light fixture, comprising:
   a printed circuit board;
   an array of LEDs coupled to the printed circuit board, wherein each LED of the array of LEDs is configured to produce a first light distribution;
   reflective wings; and
   a sheet lens including a plurality of dome portions, each dome portion having an interior surface disposed in proximity to a respective LED of the array of LEDs, wherein a distance between any point along the interior surface of the dome portion and each respective LED is substantially constant.

2. The light fixture of claim 1, wherein the sheet lens is sealed to an outer periphery of the printed circuit board along a first surface of the printed circuit board to protect the array of LEDs from contaminants.

3. The light fixture of claim 1, further including a metallic backing layer coupled to a second surface of the printed circuit board.

4. The light fixture of claim 3, wherein the sheet lens is sealed to an outer periphery of the printed circuit board along first and third surfaces of the printed circuit board and sealed to an outer periphery of the metallic backing layer along a first surface of the metallic backing layer to protect the array of LEDs from contaminants.

5. The light fixture of claim 1, wherein the sheet lens includes flat portions disposed adjacent to the plurality of dome portions, the flat portions including ridges.

6. The light fixture of claim 1, wherein the sheet lens is pneumatically manipulated to form the dome portions.

7. The light fixture of claim 1, wherein the sheet lens is thermally manipulated to form the dome portions.

8. A light fixture, comprising:
   a printed circuit board;
   an array of LEDs coupled to the printed circuit board, wherein each LED of the array of LEDs is configured to produce a first light distribution;
   reflective wings; and
   a sheet lens including a plurality of dome portions, each dome portion having an interior surface disposed in proximity to two or more LEDs of the array of LEDs, wherein a radius of the dome portion is substantially constant.

9. The light fixture of claim 8, wherein the sheet lens is pneumatically manipulated to form the dome portions.

10. The light fixture of claim 8, wherein the sheet lens is sealed to an outer periphery of the printed circuit board along a first surface of the printed circuit board to protect the array of LEDs from contaminants.

11. The light fixture of claim 8, further including a metallic backing layer coupled to a second surface of the printed circuit board.

12. The light fixture of claim 11, wherein the sheet lens is sealed to an outer periphery of the printed circuit board along first and third surfaces of the printed circuit board and sealed to an outer periphery of the metallic backing layer along a first surface of the metallic backing layer to protect the array of LEDs from contaminants.

13. The light fixture of claim 8, wherein the sheet lens includes flat portions disposed adjacent to the plurality of dome portions, the flat portions including ridges.

14. The light fixture of claim 8, wherein the sheet lens is thermally manipulated to form the dome portions.

\* \* \* \* \*